(12) United States Patent
Nejad et al.

(10) Patent No.: US 7,279,762 B2
(45) Date of Patent: *Oct. 9, 2007

(54) MAGNETORESISTIVE MEMORY DEVICE ASSEMBLIES, AND METHODS OF FORMING MAGNETORESISTIVE MEMORY DEVICE ASSEMBLIES

(75) Inventors: Hasan Nejad, Boise, ID (US); James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 31 days.

This patent is subject to a terminal disclaimer.

(21) Appl. No.: 11/295,177

(22) Filed: Dec. 5, 2005

(65) Prior Publication Data

US 2006/0076635 A1 Apr. 13, 2006

Related U.S. Application Data

(60) Continuation of application No. 10/920,740, filed on Aug. 17, 2004, now Pat. No. 7,038,286, which is a continuation of application No. 10/302,187, filed on Nov. 21, 2002, now Pat. No. 6,781,174, which is a division of application No. 10/165,352, filed on Jun. 6, 2002, now Pat. No. 6,780,653.

(51) Int. Cl.
    *H01L 29/82* (2006.01)
(52) U.S. Cl. .......................... 257/422; 438/73
(58) Field of Classification Search ................ 257/295, 257/421, 422, 427, E21.665; 438/3, 48, 438/73; 365/158, 171, 173
See application file for complete search history.

(56) References Cited

U.S. PATENT DOCUMENTS

| 5,587,943 | A | 12/1996 | Torok et al. |
| 5,956,267 | A | 9/1999 | Hurst et al. |
| 6,048,739 | A | 4/2000 | Hurst et al. |
| 6,211,090 | B1 | 4/2001 | Durlam et al. |
| 6,351,409 | B1 | 2/2002 | Rizzo et al. |
| 6,356,477 | B1 | 3/2002 | Tran |
| 6,358,757 | B2 | 3/2002 | Anthony |
| 6,404,674 | B1 | 6/2002 | Anthony et al. |
| 6,413,788 | B1 | 7/2002 | Tuttle |
| 6,430,084 | B1 | 8/2002 | Rizzo et al. |
| 6,430,085 | B1 | 8/2002 | Rizzo |
| 6,473,328 | B1 | 10/2002 | Mercaldi |
| 6,475,812 | B2 | 11/2002 | Nickel et al. |
| 6,483,740 | B1 | 11/2002 | Spitzer et al. |
| 6,501,144 | B1 | 12/2002 | Rizzo |

(Continued)

*Primary Examiner*—David Vu
(74) *Attorney, Agent, or Firm*—Wells St. John P.S.

(57) ABSTRACT

The invention includes a construction comprising an MRAM device between a pair of conductive lines. Each of the conductive lines can generate a magnetic field encompassing at least a portion of the MRAM device. Each of the conductive lines is surrounded on three sides by magnetic material to concentrate the magnetic fields generated by the conductive lines at the MRAM device. The invention also includes a method of forming an assembly containing MRAM devices. A plurality of MRAM devices are formed over a substrate. An electrically conductive material is formed over the MRAM devices, and patterned into a plurality of lines. The lines are in a one-to-one correspondence with the MRAM devices and are spaced from one another. After the conductive material is patterned into lines, a magnetic material is formed to extend over the lines and within spaces between the lines.

7 Claims, 9 Drawing Sheets

U.S. PATENT DOCUMENTS

| | | |
|---|---|---|
| 6,504,198 B2 | 1/2003 | Morimoto |
| 6,504,221 B1 | 1/2003 | Tran et al. |
| 6,525,957 B1 | 2/2003 | Goronkin et al. |
| 6,538,917 B1 | 3/2003 | Tran et al. |
| 6,538,920 B2 | 3/2003 | Sharma et al. |
| 6,538,921 B2 | 3/2003 | Daughton et al. |
| 6,656,371 B2 | 12/2003 | Drewes |
| 7,038,286 B2 * | 5/2006 | Nejad et al. ................ 257/421 |
| 2002/0132375 A1 | 9/2002 | Doan et al. |
| 2002/0160541 A1 | 10/2002 | Durcan et al. |

* cited by examiner

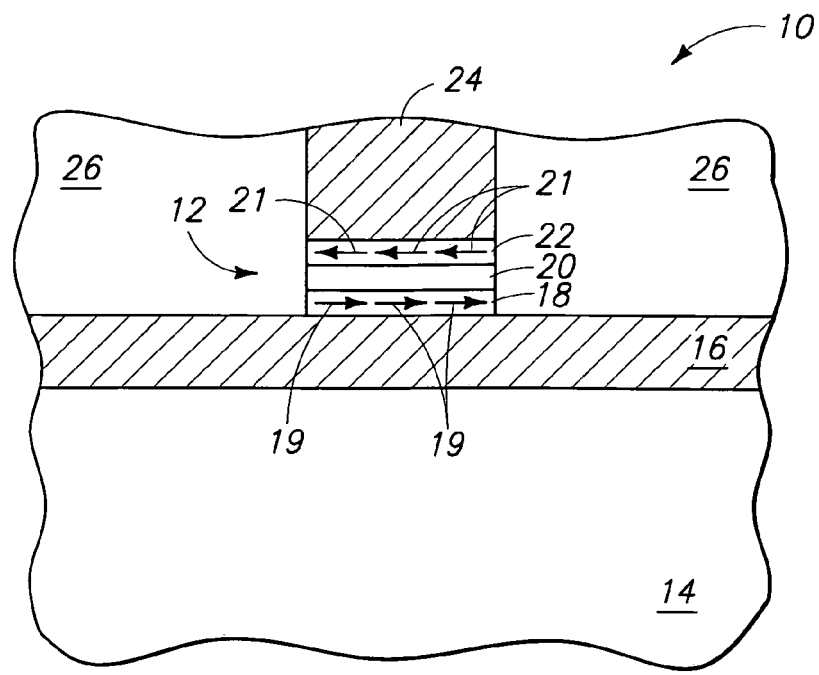
_Fig 1_
PRIOR ART
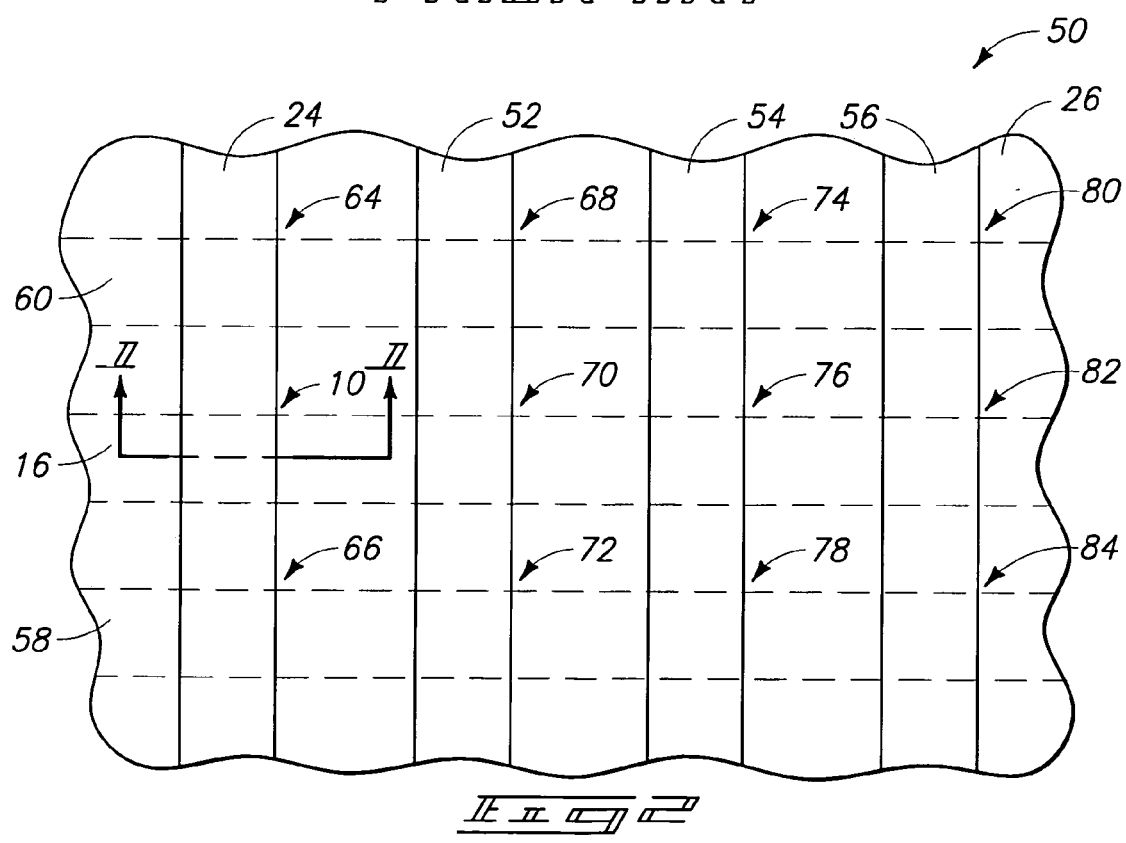
_Fig 2_
PRIOR ART

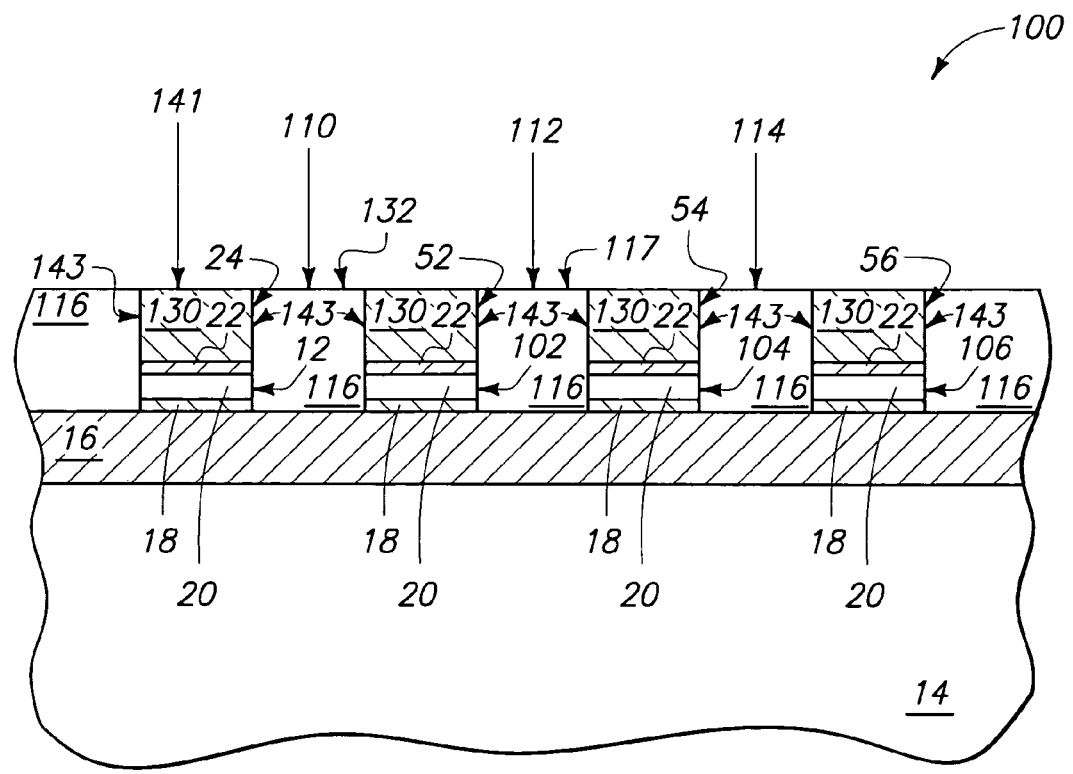
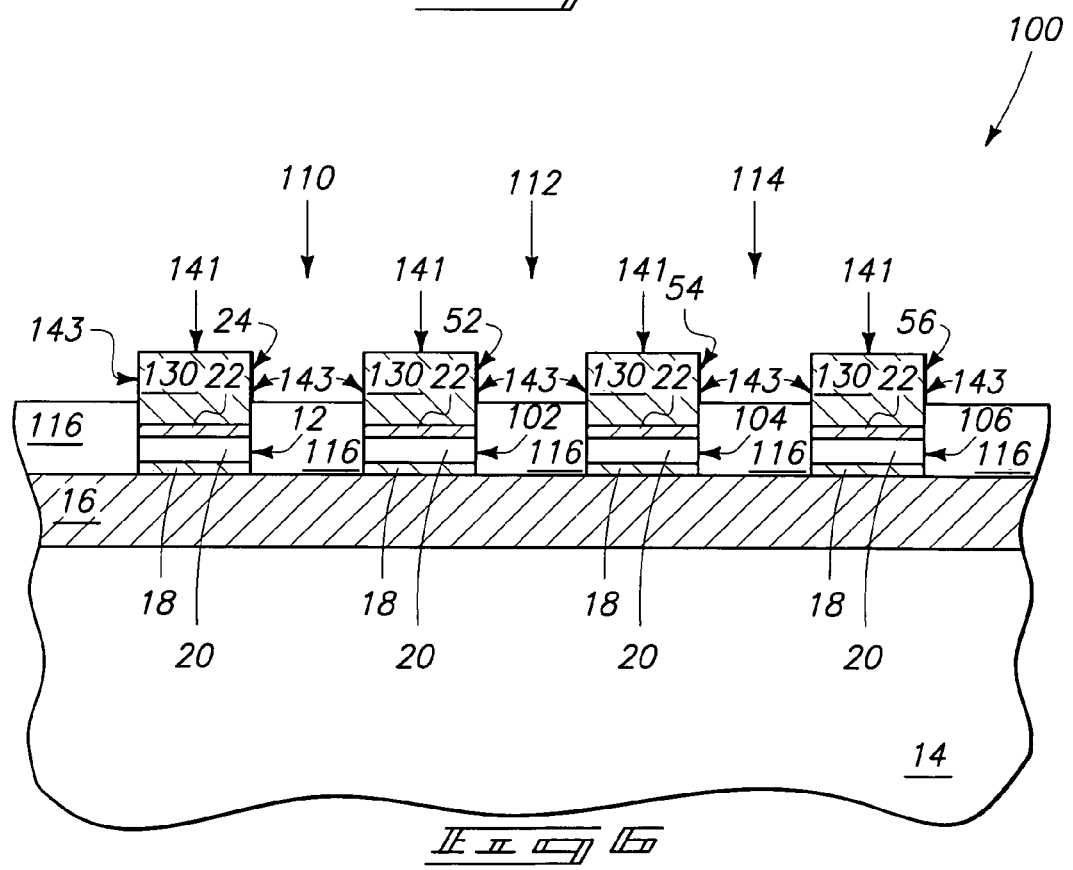

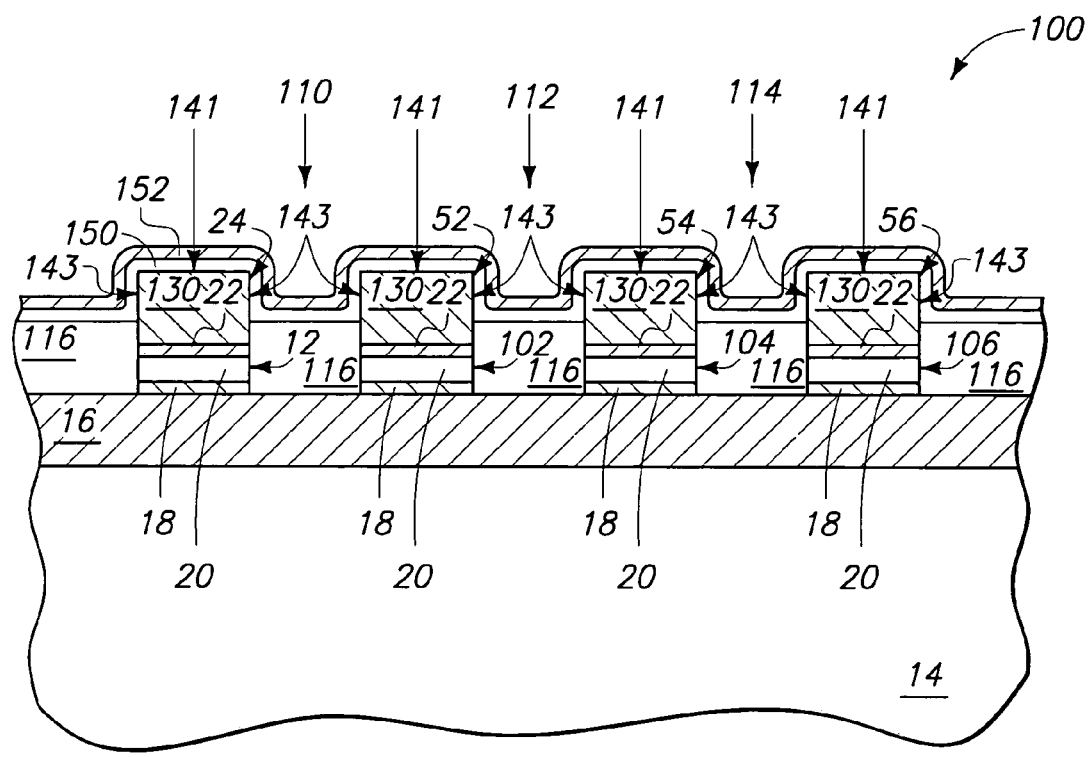
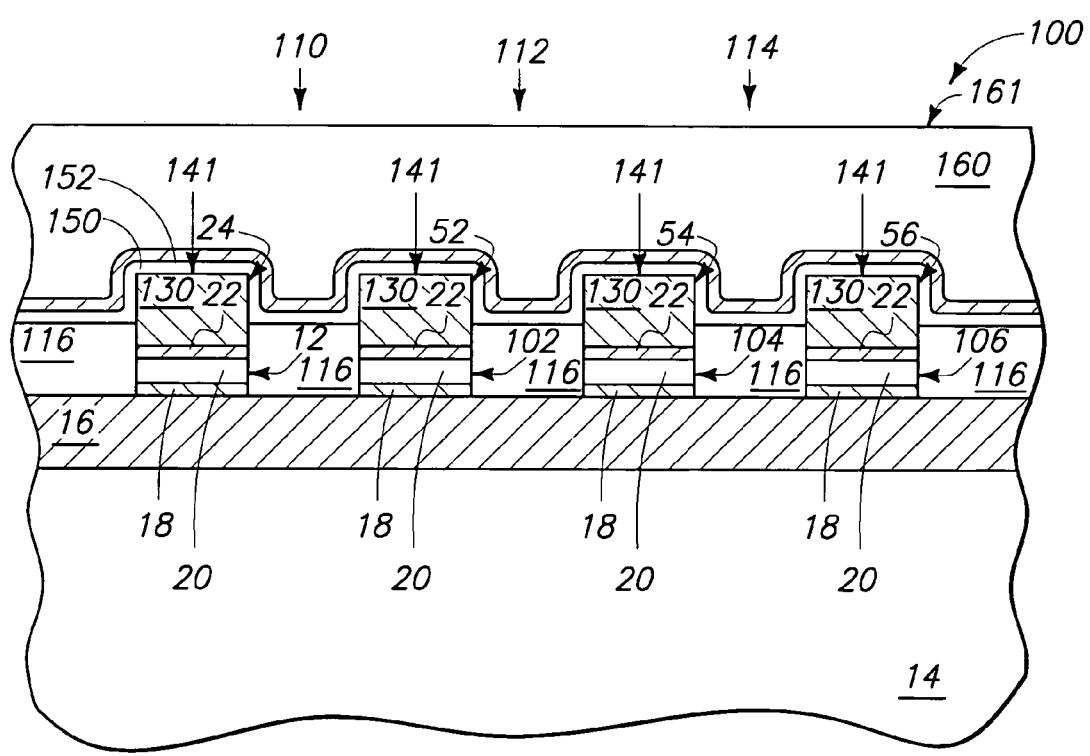

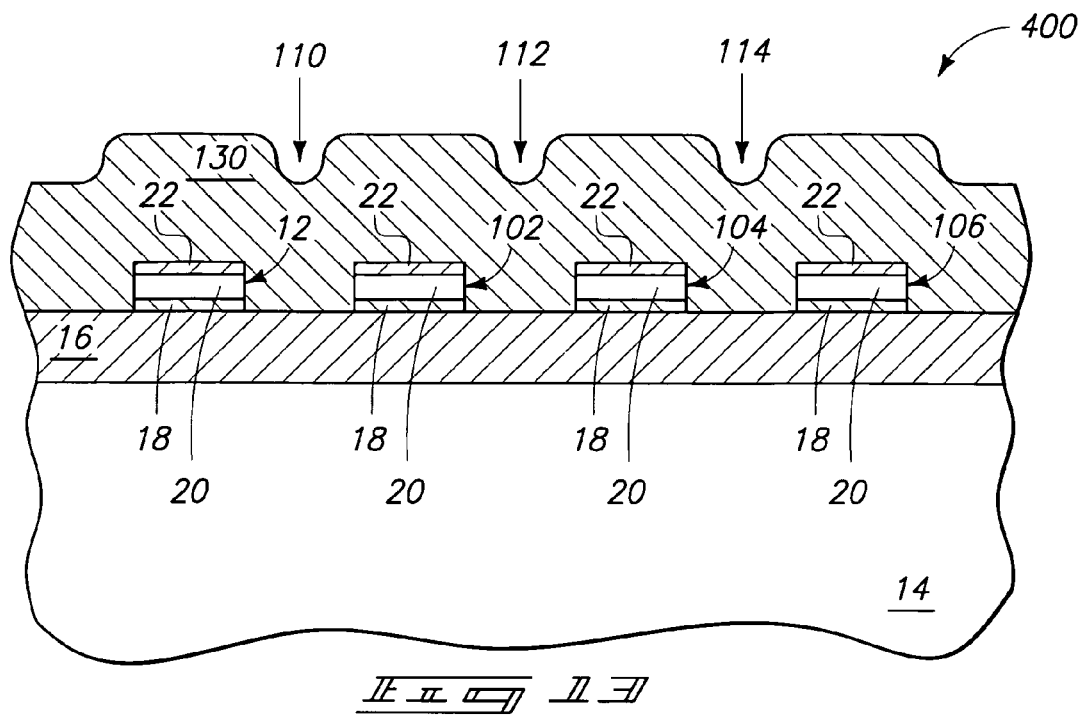
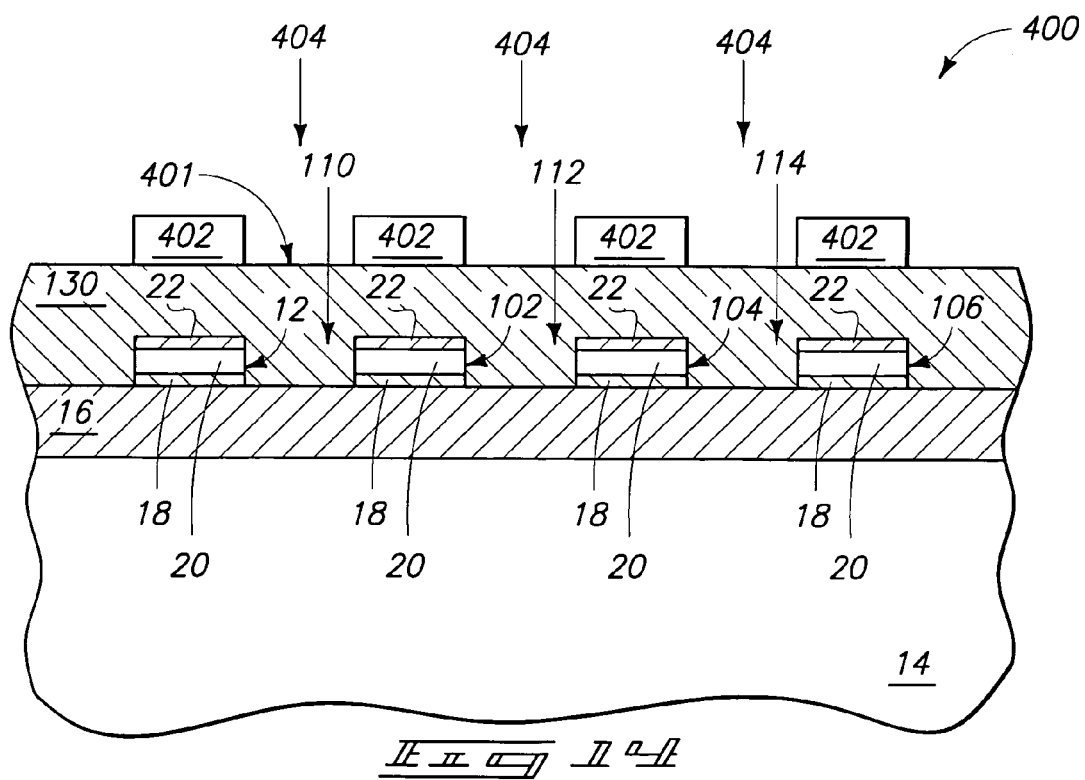

MAGNETORESISTIVE MEMORY DEVICE ASSEMBLIES, AND METHODS OF FORMING MAGNETORESISTIVE MEMORY DEVICE ASSEMBLIES

RELATED PATENT DATA

This patent resulted from a continuation application of U.S. patent application Ser. No. 10/920,740, which was filed on Aug. 17, 2004 now U.S. Pat. No. 7,032,286; which in turn resulted from a continuation application of U.S. patent application Ser. No. 10/302,187, which was filed on Nov. 21, 2002, and which issued as U.S. Pat. No. 6,781,174 on Aug. 24, 2004; which is a divisional application of U.S. patent application Ser. No. 10/165,352, which was filed on Jun. 6, 2002 now U.S. Pat. No. 6,780,653; all of the above-listed patent applications are hereby incorporated by reference.

TECHNICAL FIELD

The invention pertains to methods of forming magnetoresistive memory devices, and to methods of forming assemblies comprising magnetoresistive memory devices, such as, for example, methods of forming MRAM arrays. The invention also pertains to assemblies comprising magnetoresistive memory devices, such as, for example, MRAM arrays.

BACKGROUND OF THE INVENTION

Magnetic random access memory (MRAM) devices are showing increasing promise for utilization as memory storage devices of the future. MRAM is a type of digital memory in which digital bits of information comprise alternative states of magnetization of magnetic materials in memory cells. The magnetic materials can be thin ferromagnetic films. Information can be stored and retrieved from the memory devices by inductive sensing to determine a magnetization state of the devices, or by magnetoresistive sensing of the magnetization states of the devices. It is noted that the term "magnetoresistive device" can be utilized to characterize a memory device and not the access device, and accordingly a magnetoresistive device can be accessed by, for example, either inductive sensing or magnetoresistive sensing methodologies.

A significant amount of research is currently being invested in magnetic digital memories, such as, for example, MRAM's, because such memories are seen to have significant potential advantages relative to the dynamic random access memory (DRAM) components and static random access memory (SRAM) components that are presently in widespread use. For instance, a problem with DRAM is that it relies on electric charge storage within capacitors. Such capacitors leak electric charge, and must be refreshed at approximately 64-128 millisecond intervals. The constant refreshing of DRAM devices can drain energy from batteries utilized to power the devices, and can lead to problems with lost data since information stored in the DRAM devices is lost when power to the devices is shutdown.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, MRAM devices do not require constant refreshing, but instead store data in stable magnetic states. Further, the data stored in MRAM devices will remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices.

Although MRAM devices have potential to be utilized as digital memory devices, they are currently not widely utilized. Several problems associated with MRAM technologies remain to be addressed. It would be desirable to develop improved methods for operation of MRAM devices.

FIG. 1 illustrates a fragment of an exemplary prior art construction 10 comprising an MRAM device 12. More specifically, construction 10 comprises a substrate 14 having a conductive line 16 formed thereover, and device 12 is formed over the conductive line.

Substrate 14 can comprise an insulative material, such as, for example, borophosphosilicate glass (BPSG), silicon dioxide and/or silicon nitride. Such insulative material can be formed over a semiconductive material, such as, for example, monocrystalline silicon. Further, various integrated circuit devices can be supported by the semiconductive material. In the construction of FIG. 1, substrate 14 is illustrated generically as a homogeneous mass, but it is to be understood from the discussion above that substrate 14 can comprise numerous materials and layers. In the event that substrate 14 comprises a semiconductive material, such semiconductive material can be, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive line 16 can comprise, for example, various metals and metal alloys, such as, for example, copper and/or aluminum.

The MRAM device 12 formed over line 16 comprises three primary layers, 18, 20 and 22. Layers 18 and 22 comprise soft magnetic materials, such as, for example, materials comprising one or more of nickel, iron, cobalt, iridium, manganese, platinum and ruthenium. Layers 18 and 22 can be the same composition as one another, or different from one another.

Layer 20 comprises a non-magnetic material. The non-magnetic material can be an electrically conductive material (such as copper) in applications in which the MRAM is to be a giant magnetoresistive (GMR) device, or can be an electrically insulative material (such as, for example, aluminum oxide ($Al_2O_3$) or silicon dioxide), in applications in which the MRAM device is to be a tunnel magnetoresistive (TMR) device.

Layers 18 and 22 have magnetic moments associated therewith. The magnetic moment in layer 18 is illustrated by arrows 19, and the magnetic moment in layer 22 is illustrated by arrows 21. In the shown construction, the magnetic moment in layer 22 is anti-parallel to the magnetic moment in layer 18. Such is one of two stable orientations for the magnetic moment of layer 22 relative to that of 18, with the other stable orientation being a parallel orientation of the magnetic moment in layer 22 relative to the moment in layer 18. One of layers 18 and 22 can have a pinned orientation of the magnetic moment therein, and such can be accomplished by providing a hard magnetic layer, or in other words a permanent magnet (not shown) adjacent the layer. The layer having the pinned magnetic moment can be referred to as a reference layer.

In operation, MRAM device 12 can store information as a relative orientation of the magnetic moment in layer 22 to that in layer 18. Specifically, either the anti-parallel or parallel orientation of the magnetic moments of layers 18 and 22 can be designated as a 0, and the other of the anti-parallel and parallel orientations can be designated as a 1. Accordingly, a data bit can be stored within device 12 as the relative orientation of magnetic moments in layers 18 and 22.

A conductive line 24 is shown over layer 22, and such conductive line extends into and out of the plane of the page. Conductive line 24 can comprise, for example, one or more metals and/or metal alloys, including, for example, copper and/or aluminum.

An insulative material 26 extends over conductive line 16, and along the sides of bit 12 and conductive line 24. Insulative material 26 can comprise, for example, BPSG.

The construction 10 is an exemplary MRAM construction, and it is to be understood that various modifications can be made to the construction 10 for various applications. For instance, one or more electrically insulative layers (not shown) can be provided between device 12 and one or both of conductive lines 16 and 24. Also, one or more magnetic layers (not shown) can be stacked within device 12 in addition to the shown layers 18 and 22.

In operation, data is written to MRAM device 12 by passing current along the conductive lines 16 and 24 to change the relative magnetic orientation of layers 18 and 22 (i.e., to flip the relative orientation from parallel to anti-parallel, or vice versa). In theory, the relative orientation of layers 18 and 22 can be flipped by passing sufficient current along only one of lines 16 and 24, but in practice it is generally found to be advantageous to utilize both of lines 16 and 24 in writing information to device 12. Specifically, some current is initially passed along one of the lines 16 and 24 to induce a magnetic field in device 12 which starts to flip the relative magnetic orientation of layers 18 and 22, and then current is passed along the other of layers 16 and 24 to complete the flip of the relative magnetic orientation within device 12.

The operation of reading information from device 12 can utilize either inductive sensing or magnetoresistive sensing to detect the relative magnetic orientation of layers 18 and 22 within the device. The reading can utilize one or both of lines 16 and 24, and/or can utilize a separate conductive line (not shown).

It is advantageous to have lines 16 and 24 be orthogonal to one another at the location of device 12 to maximize the complementary effect of utilizing both of conductive lines 16 and 24. A device which utilizes a pair of independently controlled conductive lines for writing to and/or reading from an MRAM device is typically referred to as a half-select MRAM construction.

As discussed above, a single MRAM device can store a single bit of information. Accordingly, in applications in which it is desired to process multiple bits of information it is generally desired to utilize a plurality of MRAM devices, with each of the devices independently storing bits of information. The devices will typically be arranged in an array, and an exemplary array 50 of MRAM devices is illustrated in FIG. 2. More specifically, FIG. 2 shows a top view of an array comprising the construction 10 of FIG. 1. The array comprises a first set of conductive lines 24, 52, 54 and 56 within the insulative material 26; and a second set of conductive lines 16, 58 and 60. The second set of conductive lines is shown as dashed-lines to indicate that the second set of conductive lines is beneath the insulative material 26 and first set of conductive lines. Individual MRAM devices (not visible in the view FIG. 2) are at crossings of the first and second sets of conductive lines, with the locations of the devices being designated by labels 10, 64, 66, 68, 70, 72, 74, 76, 78, 80, 82, and 84. The various MRAM devices of the array would typically be fabricated identically to one another, and accordingly can all be identical to the device 12 described in FIG. 1.

Problems can be encountered during operation of an MRAM array if relatively large currents are utilized in the first and/or second sets of conductive lines during reading from and/or writing to MRAM devices. Accordingly, it would be desirable to develop methods for reducing the amount of current flow utilized in conductive lines associated with the MRAM array during reading and/or writing operations.

SUMMARY OF THE INVENTION

In one aspect, the invention encompasses a method of forming a magnetoresistive memory device assembly. A plurality of memory devices are formed to be supported by a substrate. The memory devices are spaced from one another. Each of the memory devices comprises a non-magnetic composition between a pair of magnetic compositions. An electrically conductive material is formed over the memory devices. The conductive material is patterned into a plurality of lines. The lines are in one-to-one correspondence with the memory devices and are spaced from one another. After the conductive material is patterned into lines, a magnetic material is formed over the lines. The magnetic material extends into spaces between the lines.

In one aspect, the invention encompasses a method of forming an MRAM assembly. A substrate is provided, and the substrate comprises a first electrically conductive line and a plurality of memory devices over the first line. Memory devices are spaced from one another by gaps, and the memory devices comprise a non-magnetic composition between a pair of magnetic compositions. A mass is formed over the memory devices. Openings are formed to extend through the mass and to the memory devices. An electrically conductive material is formed within the openings, and the electrically conductive material within the openings defines second electrically conductive lines over the memory devices. The second lines cross the first line at the memory devices. At least some of the mass is removed from between the second lines to form openings. A magnetic material is formed over the second lines. The magnetic material extends into the openings between the second lines.

In one aspect, the invention includes an MRAM construction. An MRAM device is between a pair of conductive lines. Each of the conductive lines can generate a magnetic field encompassing at least a portion of the MRAM device. Each of the conductive lines is surrounded on three sides by magnetic material to concentrate the magnetic fields generated by the conductive lines at the MRAM device.

BRIEF DESCRIPTION OF THE DRAWINGS

Preferred embodiments of the invention are described below with reference to the following accompanying drawings.

FIG. 1 is a diagrammatic, cross-sectional view of a fragment illustrating a prior art MRAM construction.

FIG. 2 is a diagrammatic illustration of a top view of an array comprising the MRAM construction of FIG. 1.

FIG. 5 is a view of the FIG. 3 fragment shown at a processing stage subsequent to that of FIG. 4.

FIG. 6 is a view of the FIG. 3 fragment shown at a processing stage subsequent to that of FIG. 5.

FIG. 7 is a view of the FIG. 3 fragment shown at a processing stage subsequent to that of FIG. 6.

FIG. 8 is a view of the FIG. 3 fragment shown at a processing stage subsequent to that of FIG. 7.

FIG. 13 is a diagrammatic, cross-sectional view of a fragment of an MRAM assembly at a preliminary processing stage of another aspect of the invention.

FIG. 14 is a view of the FIG. 13 fragment shown at a processing stage subsequent to that of FIG. 13.

DETAILED DESCRIPTION OF THE PREFERRED EMBODIMENTS

A first exemplary aspect of the invention is described with reference to FIGS. 3-8. Similar numbering will be used in referring to FIGS. 3-8 as was utilized above in describing prior art FIGS. 1 and 2, where appropriate.

Figure 3:
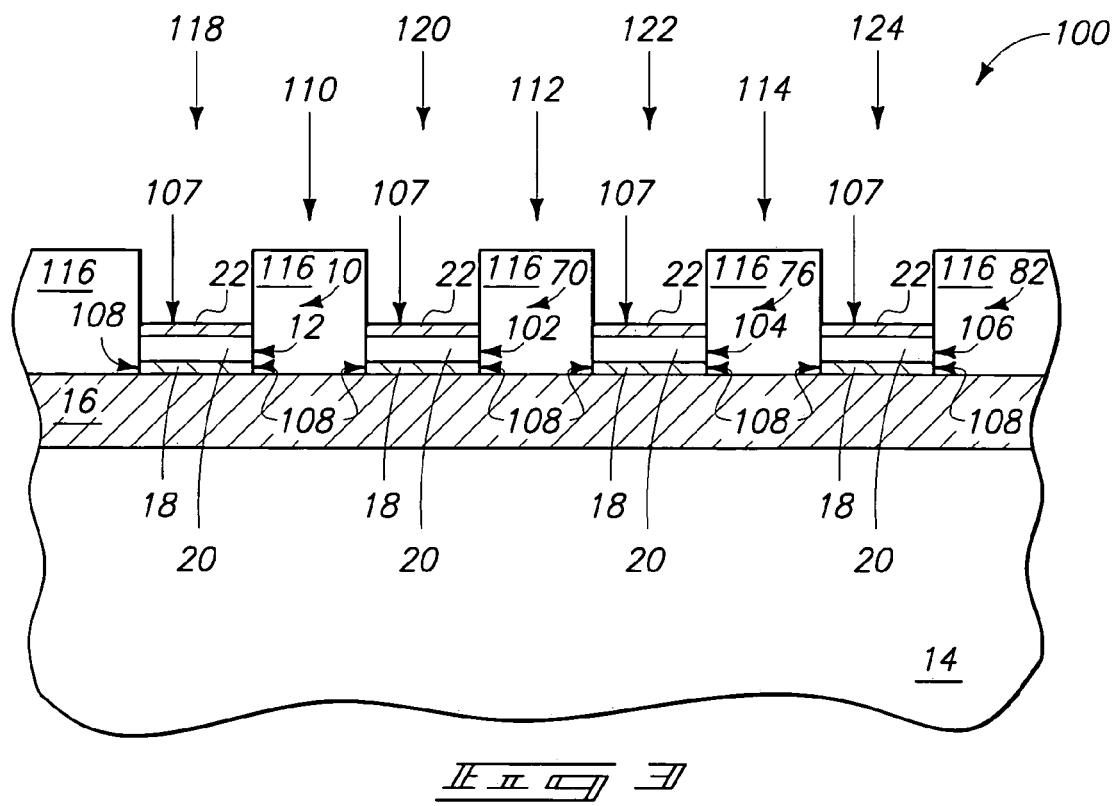
FIG. 3 is a diagrammatic, cross-sectional view of a fragment at a preliminary processing stage of an exemplary method of an aspect of the present invention.

Referring initially to FIG. 3, a construction 100 is shown in cross-sectional view. Construction 100 is illustrated at a preliminary processing step in a method of forming a magnetoresistive memory device assembly, such as, for example, an MRAM array.

Construction 100 comprises a substrate 14 supporting a conductive line 16. It is noted that in accordance with the definition of "substrate" provided in the background section of this disclosure, portion 14 alone can be considered a substrate, or alternatively, portion 14 and conductive line 16 together can be considered a substrate.

MRAM device locations 10, 70, 76 and 82 are defined over conductive line 16, and MRAM devices 12, 102, 104 and 106 are formed in the locations. The MRAM devices can be considered memory devices. Each of the memory devices comprises a non-magnetic composition (or mass) 20 between a pair of magnetic compositions (or masses) 18 and 22. The memory devices comprise upper surfaces 107, and sidewall surfaces 108.

Memory devices 12, 102, 104 and 106 are separated by spaces (or gaps) 110, 112 and 114. Accordingly, the memory devices are spaced from one another.

A mass 116 is formed over conductive line 16, and openings 118, 120, 122 and 124 extend through the mass to upper surfaces 107 of memory devices 12, 102, 104 and 106. Mass 116 can comprise, for example, an electrically insulative material, such as one or more of borophosphosilicate glass (BPSG), silicon dioxide and silicon nitride. In exemplary aspects of the invention, mass 116 can initially be formed to extend across the memory devices, and subsequently openings 118, 120, 122 and 124 can be formed within the mass. The openings can be formed by, for example, initially providing a patterned mask (not shown) over mass 116, and then extending a pattern of the mask into mass 116 to form the openings. The patterned mask can comprise, for example, photoresist, and a pattern within the mask can be formed by, for example, photolithographic processing. Openings 118, 120, 122 and 124 are complimentary to lines (discussed below) which are ultimately formed within the openings.

Figure 4:
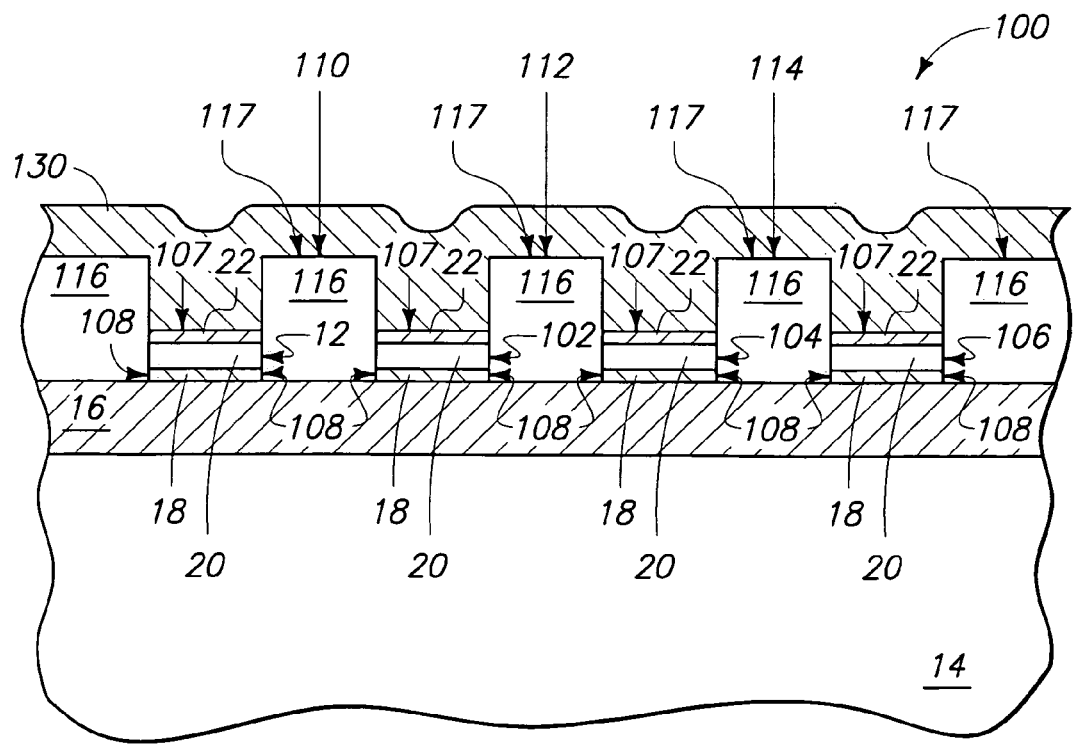
FIG. 4 is a view of the FIG. 3 fragment shown at a processing stage subsequent to that of FIG. 3.

Referring to FIG. 4, an electrically conductive material (or mass) 130 is provided over mass 116 and within openings 118, 120, 122 and 124 (FIG. 3). Conductive material 130 can comprise, for example, various metals or metal alloys, and in particular aspects can comprise one or both of copper and aluminum. Conductive material 130 is formed over memory devices 12, 102, 104 and 106, and in the shown embodiment physically contacts upper surfaces 107 of the devices. It is to be understood, however, that the invention can encompass other aspects (not shown) wherein an insulative or other material is provided over uppermost surfaces 107 prior to forming conductive material 130.

Mass 116 comprises an uppermost surface 117, and in the shown aspect of the invention, conductive material 130 is formed over uppermost surface 117.

Referring to FIG. 5, construction 100 is subjected to planarization (such as, for example, chemical-mechanical polishing) to form a planarized upper surface 132, and to remove material 130 from over uppermost surface 117 of mass 116. Planarized surface 132 is shown coextensive with uppermost surface 117 of mass 116. It is to be understood, however, that the planarization can remove portions of mass 116, in addition to removing conductive material 130 from over mass 116. Accordingly, the uppermost surface 117 of FIG. 5 can be at a lower elevational level than the uppermost surface 117 of FIG. 4. The material 130 remaining in the construction 100 of FIG. 5 forms lines 24, 52, 54 and 56. The lines are in a one-to-one correspondence with memory devices 12, 102, 104 and 106. Further, the lines are spaced from one another by gaps coextensive with the gaps 110, 112 and 114 between the memory devices. The lines have top surfaces 141, and side surfaces 143 (with the top and side surfaces being labeled for only one of the lines).

Referring to FIG. 6, some of mass 116 is removed from within gaps 110, 112 and 114, and such reduces an elevational level of the mass within the gaps. In the shown aspect of the invention, a portion of the insulative mass 116 has been removed from between the conductive lines, but the insulative mass has not been removed from between the memory devices. The portion of mass 116 remaining within gaps 110, 112 and 114 is thicker than an elevational thickness of memory devices 12, 102, 104 and 106. Accordingly, the remaining portions of mass 116 entirely cover sidewalls 108 (FIG. 3) of the memory devices. Although portions of mass 116 remain within gaps 110, 112 and 114 in the shown aspect of the invention, it is to be understood that an entirety of mass 116 can be removed from within the gaps in other aspects of the invention (discussed below). The removal of some or all of mass 116 can be accomplished with either a dry or wet etch.

The reduction in thickness of mass 116 exposes sidewalls 143 of lines 24, 52, 54 and 56.

Referring to FIG. 7, a dielectric material 150 is formed over conductive lines 24, 52, 54 and 56, as well as across upper surfaces of mass 116 within gaps 110, 112 and 114. Dielectric material 150 is formed as a continuous expanse extending along sidewall surfaces 143 and top surfaces 141 of conductive lines 24, 52, 54 and 56, as well as over the substrate 14 within the spaces 110, 112 and 114 between the conductive lines. The dielectric material can comprise, for example, one or more of silicon dioxide, silicon nitride and aluminum oxide; and can be formed to a thickness of, for example, from about 100 Å to about 200 Å. The dielectric material can be formed by, for example, chemical vapor deposition.

A magnetic material 152 is formed over dielectric material 150. The magnetic material extends over lines 24, 52, 54 and 56, and into the spaces 110, 112 and 114 between the lines. In the shown application, the magnetic material is, like the dielectric material, formed to be a continuous expanse extending along sidewall surfaces and top surfaces of lines, as well as over the substrate within spaces between the lines. The magnetic material can comprise a thickness of, for example, from about 50 Å to about 100 Å, and can comprise various ferromagnetic materials. In particular aspects, the magnetic material comprises one or more of iron, nickel and cobalt. The magnetic material can be formed by any of various deposition processes, including, for example, physical vapor deposition. An exemplary physical vapor deposition process is sputter deposition.

The magnetic material 152 can, in particular aspects, be considered a cladding around conductive lines 24, 52, 54 and 56. The cladding can concentrate magnetic fields formed by current passing through the conductive lines, and specifically can concentrate the magnetic fields within memory devices 12, 102, 104 and 106. Referring to line 24 and memory device 12 as an example, the magnetic field (or moment) induced at device 12 by current flow through line 24 can be enhanced by the cladding of magnetic material 152 relative to the magnetic field that would result from the same amount of current in the absence of the cladding. For instance, if it is desired to obtain a magnetic field of about 50 oersteds at memory device 12, a current of from about 2 milliamps to about 3 milliamps would typically be flowed through the conductive line 24 to induce the desired magnetic field. However, the presence of magnetic material 152 can enable a current flow of only 1 milliamp to be sufficient to induce the desired 50 oersteds at memory device 12. Accordingly, methodology of the present invention can enable a lower amount of current to be flowed through conductive lines proximate MRAM devices, while still producing desired magnetic fields at the devices. Such reduction in current flow can alleviate problems associated with prior art MRAM arrays.

Referring to FIG. 8, an insulative mass 160 is provided over magnetic material 152. Mass 160 comprises an upper surface 161 which can be planarized. Subsequently, additional devices (not shown) can be formed over such upper surface.

Figure 9:
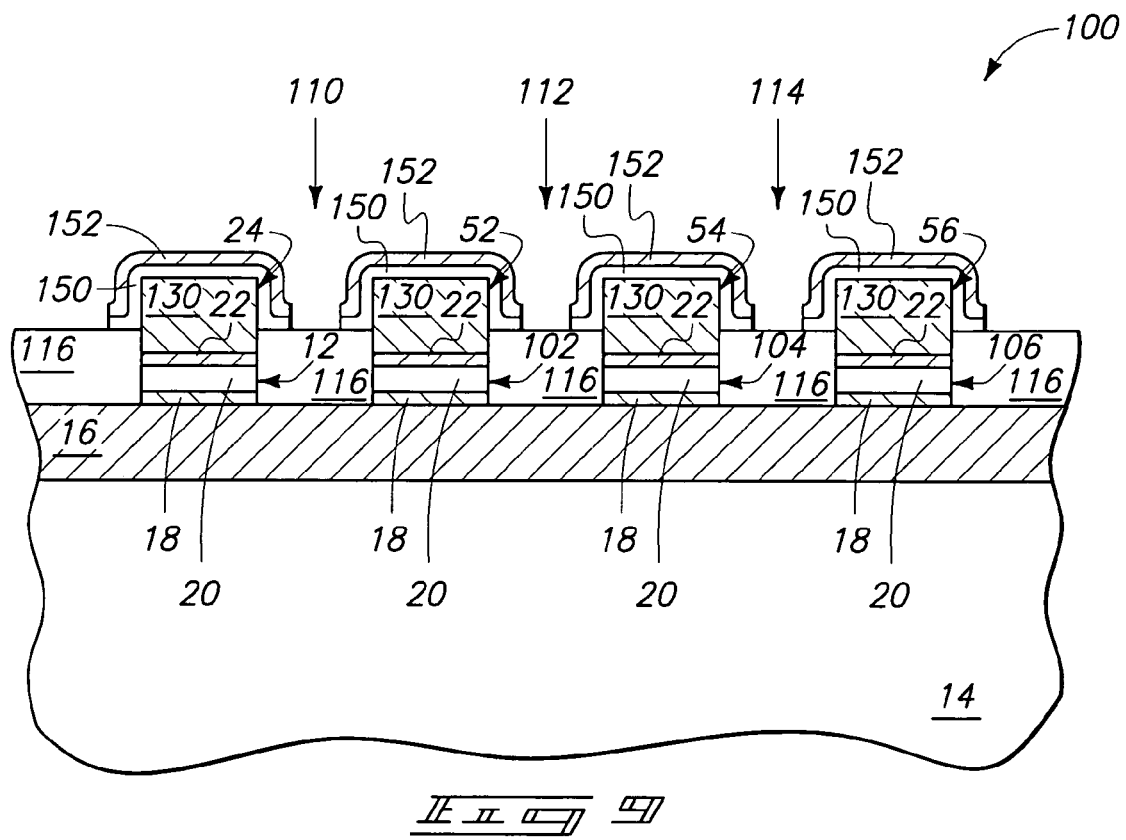
FIG. 9 is a view of the FIG. 3 fragment shown at a processing stage subsequent to that of FIG. 6, in accordance with an alternative aspect of the invention relative to that described in FIGS. 7 and 8.

The processing described above with reference to FIGS. 3-8 is but one example of processing that can be utilized to form a magnetic material around lines associated with an MRAM array. FIG. 9 illustrates another exemplary process. Specifically, FIG. 9 illustrates the construction 100 at a processing step subsequent to FIG. 7, and illustrates that segments of magnetic material 152 and dielectric material 150 have been removed from within the gaps 110, 112 and 114 between lines 24, 52, 54 and 56. However, the dielectric material 150 and conductive material 152 remain along sidewall and top surfaces of the conductive lines 24, 52, 54 and 56. Accordingly, the magnetic material 152 remains around peripheries of the conductive lines in an orientation where it can direct magnetic fields generated by current passing through the conductive lines downwardly toward memory devices beneath the conductive lines. In subsequent processing, (not shown) an insulative material (such as the material 160 of FIG. 8) can be formed over the conductive lines and across the gaps between the conductive lines.

Another aspect of the invention is described with reference to FIGS. 10 and 11. In referring to FIGS. 10 and 11, similar numbering will be used as was utilized above in describing FIGS. 3-8, where appropriate.

Figure 10:
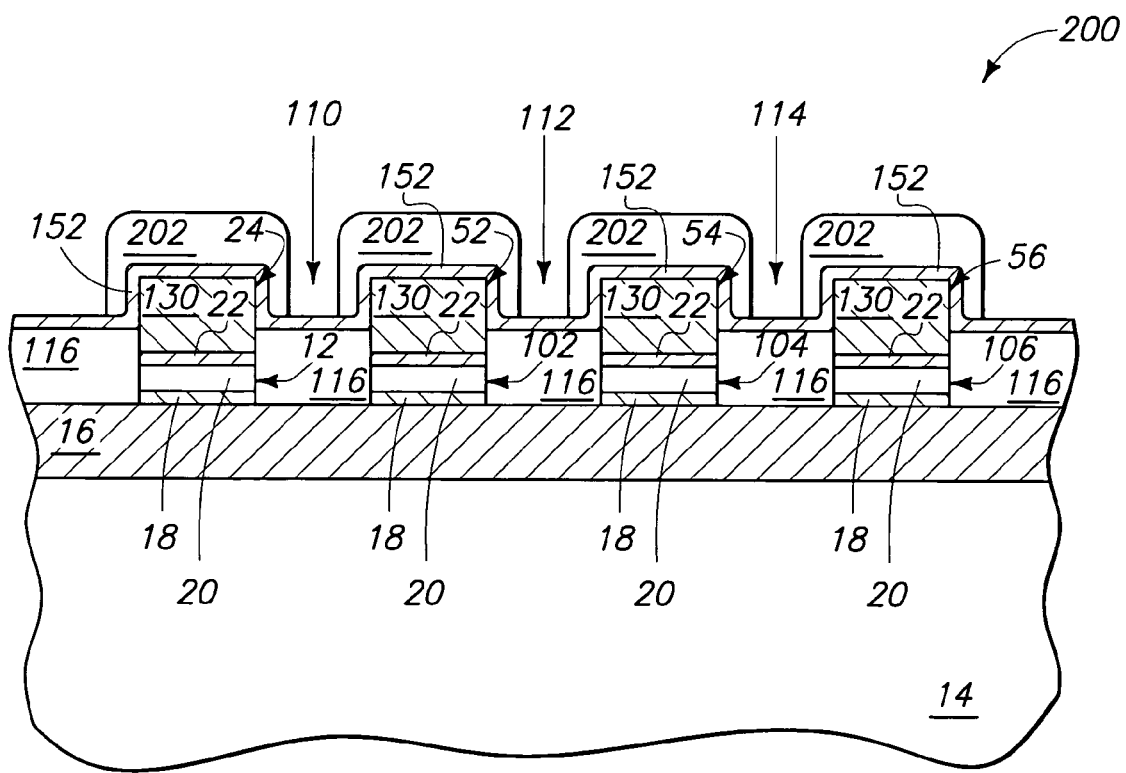
FIG. 10 is a view of the FIG. 3 fragment shown at a processing stage subsequent to that of FIG. 6 in accordance with another alternative aspect of the invention.

Referring to FIG. 10, a construction 200 is illustrated at a processing step subsequent to FIG. 6. Magnetic material 152 is formed over lines 24, 52, 54 and 56. The magnetic material extends along sidewall and top surfaces of the lines, and further extends across gaps 110, 112 and 114 between the lines. The construction 200 of FIG. 10 is shown at a similar processing step to the construction 100 of FIG. 7, but differs from the construction 100 of FIG. 7 in that the dielectric material 150 (FIG. 7) is not provided in the construction 200.

A patterned mask 202 is formed over portions of magnetic material 152 associated with conductive lines 24, 52, 54 and 56 while leaving portions of magnetic material 152 within gaps 110, 112 and 114 exposed. Patterned mask 202 can comprise, for example, photoresist, and can be patterned utilizing photolithographic processing.

Figure 11:
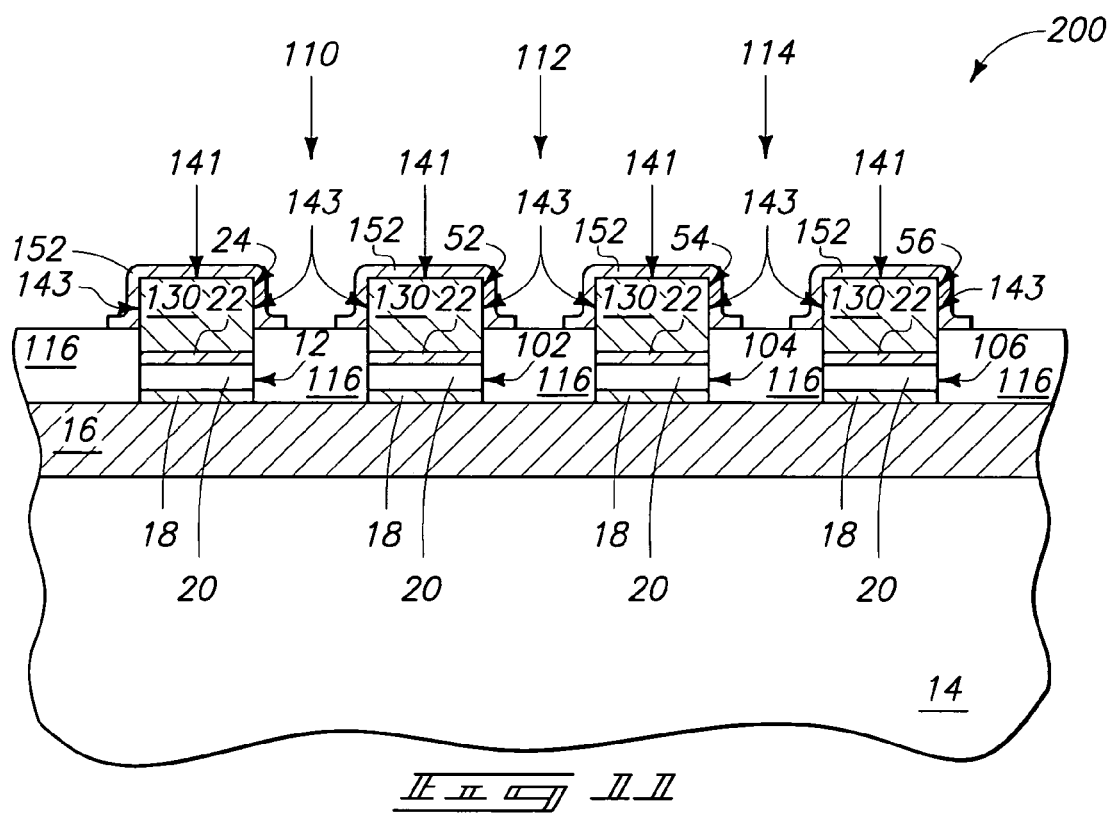
FIG. 11 is a view of the FIG. 3 fragment shown at a processing stage subsequent to that of FIG. 10.

Referring to FIG. 11, exposed portions of magnetic material 152 are removed from within gaps 110, 112 and 114, and subsequently mask 202 (FIG. 10) is removed. The magnetic material 152 remaining is along sidewalls 143 and top surfaces 141 of lines 24, 52, 54 and 56. Further, magnetic material 152 is physically against such sidewall and top surfaces of the lines. It is preferred that magnetic material 152 does not contact either of the magnetic compositions 18 and 22 of memory devices 12, 102, 104 and 106. The insulative material 116 previously formed within gaps 110, 112 and 114 prevents magnetic material 152 from physically contacting the magnetic compositions of the memory devices.

The removal of exposed portions of magnetic material 152 to form the shown pattern in FIG. 11 can be considered as transferring a pattern from mask 202 to the underlying conductive material 152.

Figure 12:
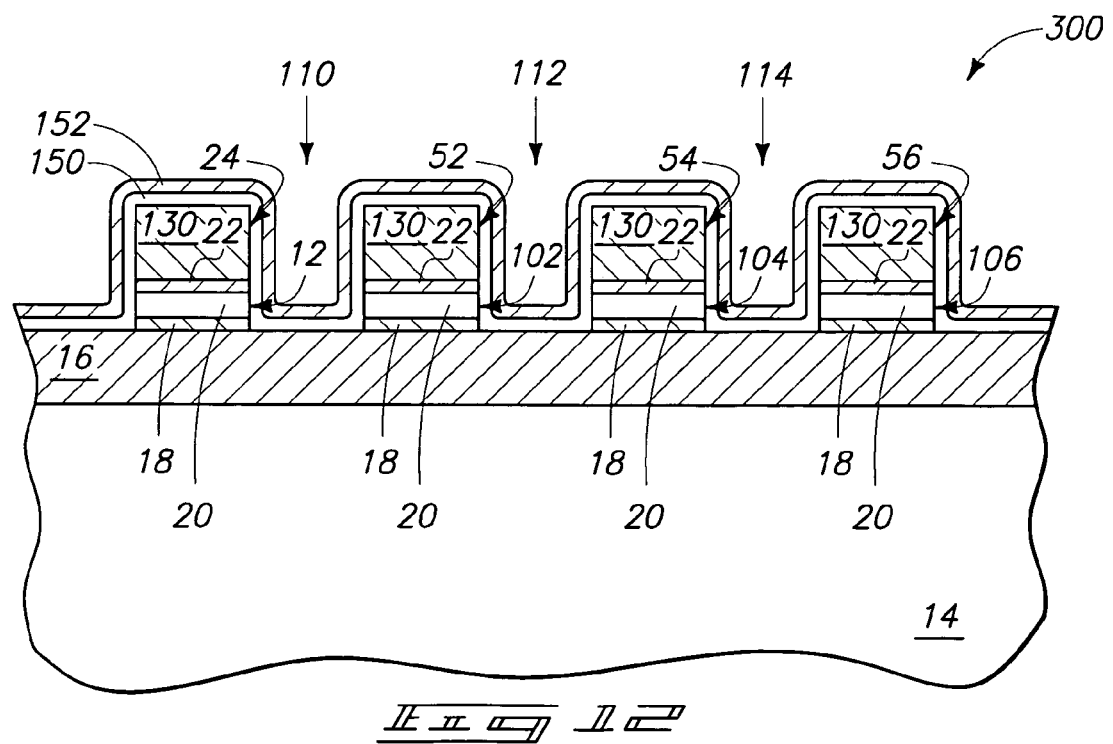
FIG. 12 is a view of the FIG. 3 fragment shown at a processing stage subsequent to that of FIG. 5 in accordance with yet another alternative aspect of the invention.

Another aspect of the invention is described with reference to FIG. 12. In describing FIG. 12 similar numbering will be used as was utilized above in describing FIGS. 3-8, where appropriate. FIG. 12 illustrates a construction 300 shown at a processing step subsequent to that of FIG. 5. Specifically, the insulative mass 116 (FIG. 5) has been entirely removed from within gaps 110, 112 and 114, and subsequently dielectric material 150 and magnetic material 152 are formed. The dielectric material 150 prevents magnetic material 152 from physically contacting magnetic compositions 18 and 22 of memory devices 12, 102, 104 and 106. In subsequent processing (not shown) one or both of magnetic material 152 and dielectric material 150 can be removed from within gaps 110, 112 and 114. Alternatively, materials 150 and 152 can be left within gaps 110, 112 and 114 in completed devices formed in accordance with the methodology of FIG. 12.

Figure 15:
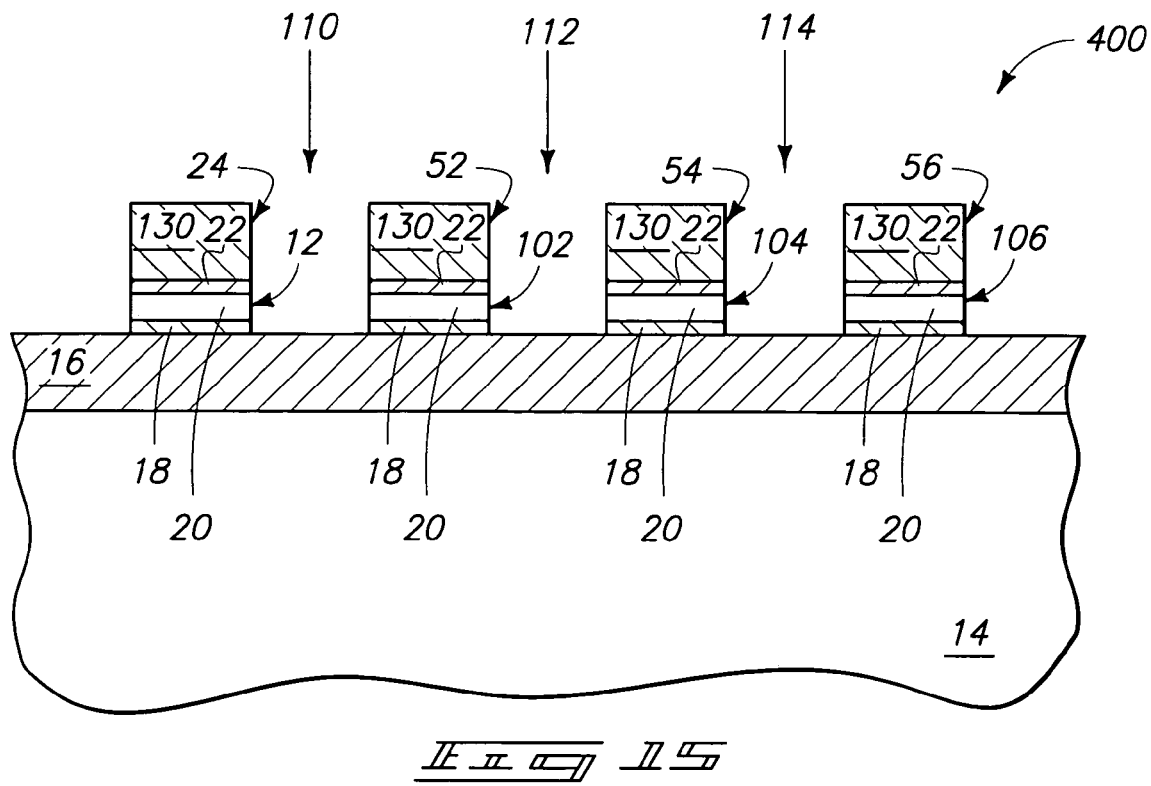
FIG. 15 is a view of the FIG. 13 fragment shown at a processing stage subsequent to that of FIG. 14.

FIGS. 13-15 illustrate another aspect of the invention. In referring to FIGS. 13-15 similar numbering will be used as was utilized above in describing the embodiment of FIGS. 3-8, where appropriate. FIG. 13 illustrates a construction 400 comprising substrate 14, conductive line 16, and memory devices 12, 102, 104 and 106. Electrically conductive material 130 is formed over memory devices 12, 102, 104 and 106, as well as within gaps 110, 112 and 114 between the devices.

Referring to FIG. 14, an upper surface of material 130 is planarized to form a planar upper surface 401. The planarization can be accomplished by, for example, chemical-mechanical polishing. A patterned mask 402 is formed over planar surface 401. Mask 402 can comprise, for example, photoresist and can be patterned utilizing photolithographic processing. Mask 402 comprises portions over memory devices 12, 102, 104 and 106. Gaps 404 are between the portions of mask 402, and conductive material 130 is exposed within such gaps. Gaps 404 are over the spaces 110, 112 and 114 between memory devices 12, 102, 104 and 106.

68 Referring to FIG. 15, a pattern is transferred from mask 402 (FIG. 14) to conductive material 130, and subsequently mask 402 is removed. The transferring of the pattern from mask 402 to material 130 results in portions of conductive material exposed within openings 404 (FIG. 14) being removed. The conductive material 130 remaining at the processing stage of FIG. 15 is in the form of lines 24, 52, 54 and 56. In subsequent processing (not shown) an insulative material can be provided between memory devices 12, 102, 104 and 106 to form a layer analogous to the layer 116 of FIG. 6. Subsequently, any of the processing described above with references to FIGS. 7-11 can be conducted to form the various constructions showing FIGS. 7-11. Alternatively, the dielectric material 150 and magnetic material 152 (discussed above) can be provided over lines 24, 52, 54 and 56, as well as within spaces between the lines to generate a construction analogous to that shown in FIG. 12.

The conductive lines 24, 52, 54 and 56 discussed above with references to various of FIGS. 3-15 can have a same type of relative configuration as that shown in the array of FIG. 2, and further the conductive line 16 of FIGS. 3-15 can have the same type of configuration as that shown in the array of FIG. 2. Accordingly, lines 24, 52, 54 and 56 can be considered to cross line 16 at locations corresponding to memory devices 12, 102,104 and 106. Additionally, lines 24, 52, 54 and 56 can extend along directions that are primarily parallel to one another, and further can extend along directions which are substantially orthogonal to the direction along which conductive line 16 extends. The term "substantially orthogonal" is utilized to indicate that lines 24, 52, 54 and 56 can be orthogonal relative to line 16 within tolerances of fabrication and measurement, which can be different than "orthogonal" is understood in an absolute mathematical sense.

The magnetic material 152 (see, for example, FIGS. 8, 9, 11 and 12) can be considered to be a three-sided magnetic flux concentrator conductor which concentrates a magnetic field within an adjacent memory device. Various methods have been developed for providing magnetic flux concentrators around a bottom line associated with magnetoresistive devices (see, for example, U.S. Pat. No. 5,956,267). The present invention provides a method for forming flux concentrators around the top lines associated with an MRAM array. Methodology of the present invention can be utilized in combination with the prior art methodology to form MRAM arrays in which flux concentrators are provided around both bottom and top lines. It is considered that if flux concentrators are provided on three sides of bottom lines, and also on three sides of top lines, the magnetic field induced by current flow through the top and bottom lines can be increased by at least two times relative to a current flow which would exist in the absence of the flux concentrators, and possibly by four times, or even more than four times, relative to the magnetic field that would be induced in the absence of the flux concentrators.

Figure 16:
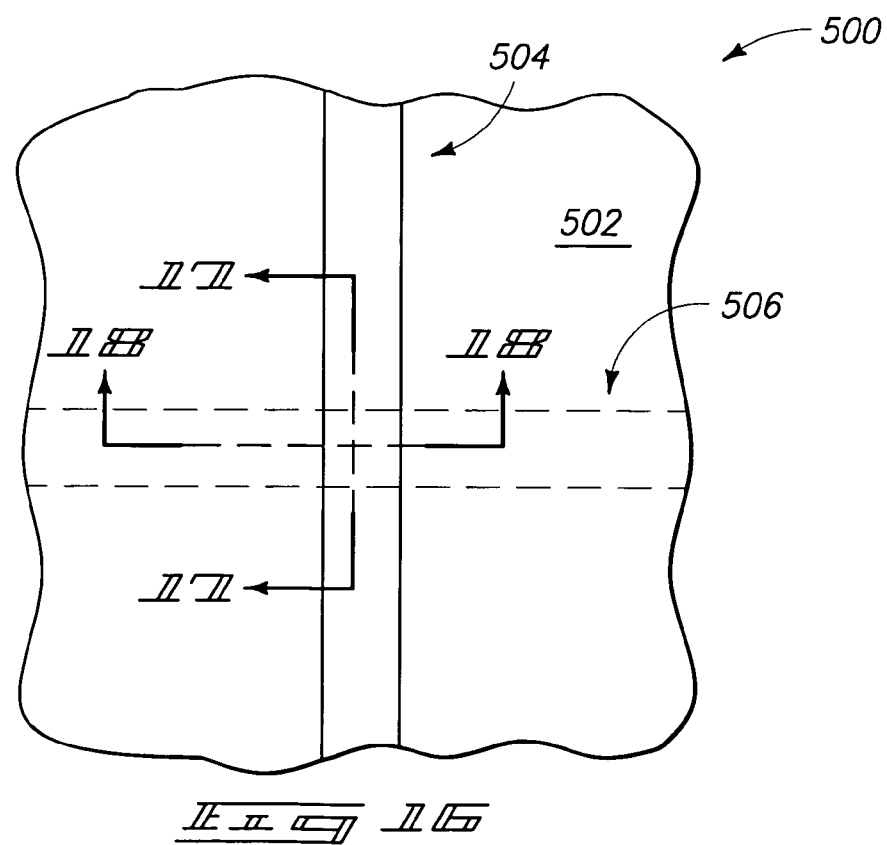
FIG. 16 is a diagrammatic, top view of an MRAM assembly illustrating a further aspect of the invention.
Figure 17:
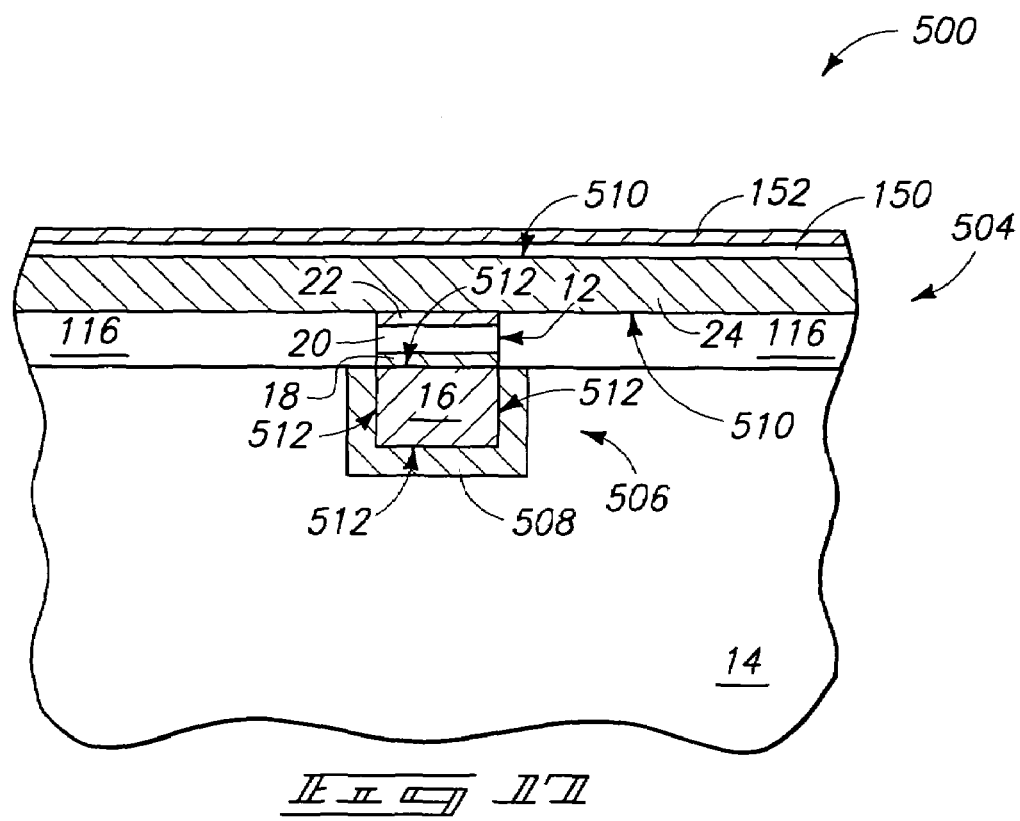
FIG. 17 is a diagrammatic, cross-sectional view along the line 17-17 of FIG. 16.
Figure 18:
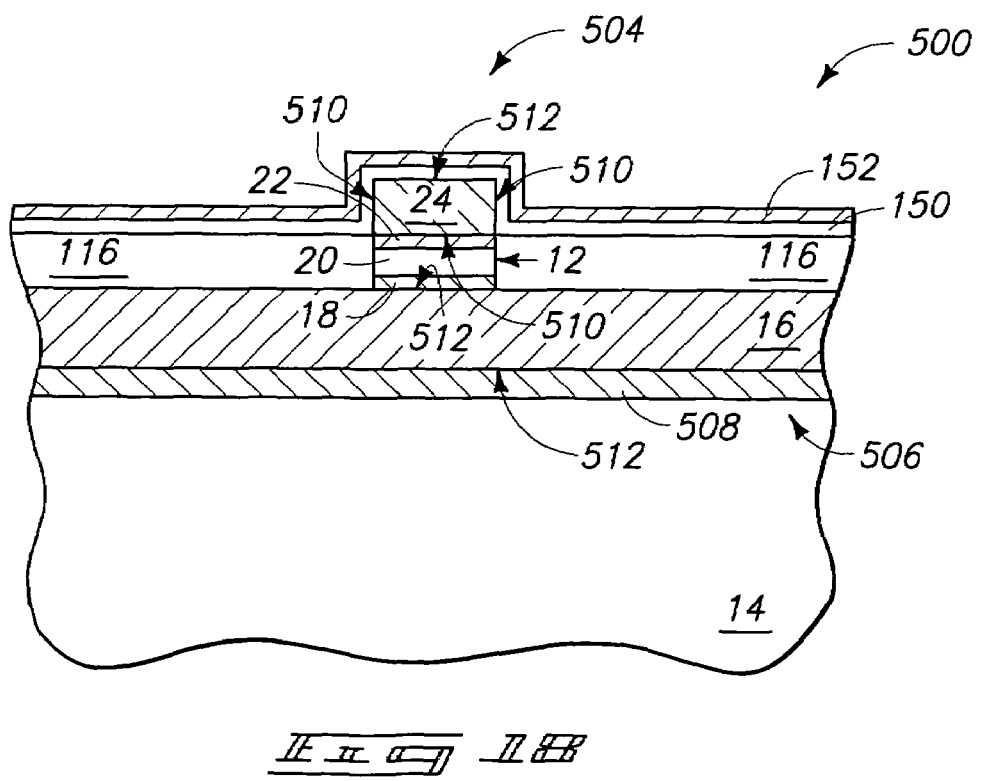
FIG. 18 is a diagrammatic, cross-sectional view along the line 18-18 of FIG. 16.

FIGS. 16-18 illustrate an aspect of the invention in which flux concentrators are provided around opposing lines (such as bottom and top lines) associated with a half-select MRAM device. Similar numbering will be utilized in referring to FIGS. 16-18 as was used in describing the constructions of FIGS. 3-15, where appropriate.

Referring to FIG. 16, a construction 500 is illustrated in top view. Construction 500 comprises a substrate 502 and a pair of line constructions 504 and 506 supported by the substrate. The lines cross at an MRAM device (not visible in the view of FIG. 16).

Referring to the cross-sectional views of FIGS. 17 and 18, the MRAM device between the line constructions is visible as a device 12. Device 12 comprises a pair of magnetic compositions (18 and 22) separated by a non-magnetic composition (20). Device 12 can be part of an MRAM array.

An electrically insulative mass 116 is along sidewalls of device 12, and line construction 504 is over the mass 116. Line construction 504 comprises a conductive line 24 having an outer periphery 510. Line 24 is surrounded on three sides by dielectric material 150 and magnetic material 152. In particular aspects, magnetic material 152 can be considered to surround a portion, and only a portion, of outer periphery 510 of line 24. Although magnetic material 152 is shown extending entirely across the sides of line 24, it is to be understood that the magnetic material can, in alternative aspects of the invention, extend only partially along the sides of line 24. Also, although line 24 is shown having a rectangular cross-sectional shape across an end of the line (see FIG. 18), and to accordingly have four sides to outer periphery 510, it is to be understood that line 24 can have other shapes.

Device 12 is over line construction 506. Line construction 506 comprises a conductive line 16 having an outer periphery 512. Line 16 is surrounded on three sides by a magnetic material 508. Line construction 506 can be formed by, for example, methodology described in U.S. Pat. No. 5,956,267. In particular aspects, magnetic material 508 can be considered to surround a portion, and only a portion, of outer periphery 512 of line 16. Although magnetic material 508 is shown extending entirely across the sides of line 16, it is to be understood that the magnetic material can, in alternative aspects of the invention, extend only partially along the sides of line 16. Also, although line 16 is shown having a rectangular cross-sectional shape across an end of the line (see FIG. 17), and to accordingly have four sides to outer periphery 512, it is to be understood that line 16 can have other shapes.

Magnetic material 508 can be identical in composition to magnetic material 152, or different. In particular aspects, both of magnetic materials 508 and 152 will comprise one or more of Fe, Ni and Co.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A magnetoresistive memory array, comprising:
   a plurality of memory cells, individual memory cells including a non-magnetic composition between a pair of magnetic compositions;
   first electrically conductive contacts on first sides of the individual memory cells; the first electrically conductive contacts being configured to generate first magnetic fields overlapping at least portions of the individual memory cells when current is passed through the first electrically conductive contacts;
   first magnetic material located outwardly of the first electrically conductive contacts and configured to concentrate the first magnetic fields;
   second electrically conductive contacts located on opposite sides of the individual memory cells to the first sides; the second electrically conductive contacts being configured to generate second magnetic fields overlapping at least portions of the individual memory cells when current is passed through the second electrically conductive contacts; and
   second magnetic material outwardly of the second electrically conductive contacts and configured to concentrate the second magnetic fields.

2. The array of claim 1 wherein the first electrically conductive contacts are one or more lines comprising rectangular cross-sectional shapes; wherein outer peripheries of the one or more lines extend along four sides of the rectangular cross-sectional shapes; and wherein the first magnetic material associated with a line extends entirely along three of the four sides.

3. The array of claim 1 wherein the first electrically conductive contacts are one or more lines comprising rectangular cross-sectional shapes; wherein outer peripheries of the one or more lines extend along four sides of the rectangular cross-sectional shapes; and wherein the first magnetic material associated with a line extends entirely along one of the four sides, and extends only partially along two other of the four sides.

4. The array of claim 1 wherein the second electrically conductive contact are one or more lines comprising rectangular cross-sectional shapes; wherein outer peripheries of the one or more lines extend along four sides of the rectangular cross-sectional shapes; and wherein the second magnetic material associated with a line extends entirely along three of the four sides.

5. The structure of claim 1 wherein the first and second magnetic materials both comprise one or more of Fe, Ni and Co.

6. The structure of claim 1 wherein the first and second magnetic materials are identical in composition relative to one another.

7. The structure of claim 1 wherein the first and second magnetic materials are different in composition relative to one another.

* * * * *